US012501591B2

(12) United States Patent
Rademacher (10) Patent No.: US 12,501,591 B2
(45) Date of Patent: Dec. 16, 2025

(54) ELECTRIC COUPLING SYSTEM (71) Applicant: Aptiv Technologies AG, Schaffhausen (CH)

(72) Inventor: Falk Rademacher, Gummersbach (DE)

(73) Assignee: Aptiv Technologies AG, Schaffhausen (CH)

( * ) Notice: Subject to any disclaimer, the term of this patent is extended or adjusted under 35 U.S.C. 154(b) by 198 days.

(21) Appl. No.: 18/509,996

(22) Filed: Nov. 15, 2023

(65) Prior Publication Data

US 2024/0164067 A1 May 16, 2024

(30) Foreign Application Priority Data

Nov. 16, 2022 (EP) .................................... 22207802

(51) Int. Cl.
*H05K 7/20* (2006.01)
*H05K 5/00* (2006.01)

(52) U.S. Cl.
CPC ....... *H05K 7/20854* (2013.01); *H05K 5/0069* (2013.01); *H05K 5/0073* (2013.01)

(58) Field of Classification Search
CPC . H05K 7/20854; H05K 5/0069; H05K 5/0073
USPC ........................................................ 361/709
See application file for complete search history.

(56) References Cited

U.S. PATENT DOCUMENTS

| 7,008,240 B1* | 3/2006 | Wang | H05K 5/0269 |
| | | | 439/946 |
| 2014/0362533 A1* | 12/2014 | Shin | H05K 7/2039 |
| | | | 361/707 |
| 2018/0244301 A1* | 8/2018 | Fujimoto | B62D 5/046 |
| 2019/0351935 A1* | 11/2019 | Kim | B62D 5/046 |
| 2021/0028673 A1* | 1/2021 | Kim | H02K 11/30 |

FOREIGN PATENT DOCUMENTS

| DE | 102005036300 A1 | 2/2007 | |
| EP | 2075162 A1 * | 7/2009 | ........... H01R 13/518 |

OTHER PUBLICATIONS

Extended European Search Report for EP App. No. 22207802.4, dated May 9, 2023, 6 pages.

* cited by examiner

*Primary Examiner* — Zhengfu J Feng
(74) *Attorney, Agent, or Firm* — Miller Johnson (57) ABSTRACT

Disclosed is an electric coupling system including an electronic control unit (ECU). The ECU includes an ECU housing having at least one guide element and a first thermal contact surface. The ECU includes an electric connector. The electric coupling system further includes a receiving unit for coupling with the ECU. The receiving unit includes a receiving housing to accommodate the ECU at least partially, the receiving housing including at least one guide track and a heat sink with a second thermal contact surface for establishing planar contact with the first thermal contact surface. The receiving unit further includes an electric counter connector for mating with the electric connector.

17 Claims, 6 Drawing Sheets

ELECTRIC COUPLING SYSTEM

CROSS-REFERENCE TO RELATED APPLICATIONS

This application claims priority to EP App. No. 22 207 802 filed Nov. 16, 2022, the entire disclosure of which is incorporated by reference.

FIELD

The present disclosure relates to an electric coupling system and more particularly to an electronic control unit and a receiving unit for coupling with the electronic control unit.

BACKGROUND

An electronic control unit, also known as an ECU, is an embedded system in automotive electronics that controls one or more of the electrical systems and/or subsystems in a car or any other vehicle. A reliable operation of electronic control units is critical for the safety and/or the functionality of the vehicle. Thereby different requirements exist for the reliable operation of ECUs.

Particularly, an ECU is usually connected to an associated receiving unit e.g. in a motor vehicle. On this connection various requirements are placed. Generally, it is necessary that the ECU with the associated receiving unit ensures a reliable electrical connection that can for example withstand the mechanical operating loads. Moreover, it is necessary that the ECU is connectable with an associated receiving unit without damaging and also in an easy manner. In addition, for most ECUs, reliable and sufficient heat dissipation to a heat sink, which is part of the receiving unit, must be ensured. This is as usually an ECU comprises at least one electric component which generates thermal energy. Some electric components generate thermal energy to an extent that external cooling is required. If this thermal energy is not dissipated, it may cause defects. Hence, an uncooled or insufficiently cooled electric component, such as an integrated circuit, can be damaged and/or shut itself down.

In summary, an electrical, a mechanical, and a thermal connection between an ECU and a receiving unit should be established as simply and reliably as possible.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A solution approach known from the prior art can be described as follows. An ECU is provided having an electrical connector and a housing with a first thermal contact surface. Also provided is a receiving unit having an electrical counter connector and a housing with a second thermal contact surface which is e.g. provided by a heat sink. Further, the housing of the receiving unit has a guide for inserting the ECU into the receiving unit, wherein the guide is configured such that the thermal contact surfaces first must be aligned parallel, and then must be slid over each other also in parallel. The electrical contact is established as soon as the ECU is fully inserted into the receiving unit.

As above, this solution aims to establish an electrical, a mechanical, and a thermal connection between the ECU and the receiving unit as simply and reliably as possible. However, the above solution approach known from the prior art, so as other known approaches, has several drawbacks, as set out in the following.

First, sliding the thermal contact surfaces over each other in parallel has proven to be disadvantageous in that damage to these surfaces often occurs, resulting in poorer heat dissipation from the ECU. A thermal interface material being provided on one of the thermal contact surfaces may be scraped off when sliding the thermal contact surfaces over each other.

Second, it has shown that in the described prior art solution the thermal contact surfaces rest on each other and are not or only insufficiently pressed against each other. Accordingly, there is limited heat transfer from the ECU to the receiving unit.

Third, it has been shown that the solution described above, like other prior art solutions, is limited in terms of the reliability of the electrical connection and/or the mechanical connection. Particularly, because known ECUs tend to become at least partially detached from the receiving unit, so that especially the electrical connection only functions to a limited extent.

Thus, it is an object of the present disclosure to provide an electric coupling system that overcomes the aforementioned drawbacks at least partially. This object is achieved, at least partly, by an electric coupling system, as defined in the independent claim. Further aspects of the present disclosure are defined in the dependent claims.

In particular, the object is achieved by an electric coupling system comprising an electronic control unit (ECU). The ECU comprises an ECU housing having at least one guide element and a first thermal contact surface, and an electric connector. The electric coupling system further comprises a receiving unit for coupling with the ECU. The receiving unit comprises a receiving housing to accommodate the ECU housing at least partially. The receiving housing comprises at least one guide track and a heat sink with a second thermal contact surface for establishing planar contact with the first thermal contact surface, and an electric counter connector for mating with the electric connector. The guide element and the guide track are configured to be brought into sliding engagement with each other such that the ECU can be inserted and slide into the receiving housing, wherein the guide element and the guide track are further configured such that the ECU can be rotated relative to the receiving unit while coupling the ECU with the receiving unit.

As mentioned regarding the prior art, an electronic control unit, also known as an ECU, is an embedded system in automotive electronics that controls one or more of the electrical systems and/or subsystems in a car or any other vehicle. The ECU may comprise an engine control module, a powertrain control module, a transmission control module, a brake control module, a central control module, a central timing module, a general electronic module, a body control module, and/or a suspension control module.

The ECU housing and/or the receiving housing may each comprise several individual housing components which are connected by screwing, welding, and/or adhering. However, it is understood that the ECU housing and/or the receiving housing alternatively may be integrally formed.

Moreover, the ECU may comprise at least one electric component, such as an integrated circuit, which generates thermal energy. The thermal energy may heat the first thermal contact surface of the ECU housing. A layer of thermal interface material may be provided between the electric component and the ECU housing to transfer ensure heat transfer. Further, the ECU may comprise a printed circuit board, wherein the at least one electric component and/or the electric connector are attached to the printed circuit board. It is understood that the printed circuit board may be arranged inside the ECU housing.

The heat sink may be also referred to as a heat-dissipating device for transferring thermal energy. For transferring thermal energy, the heat sink may rely on a fluid medium comprising air, water, refrigerants and/or oil. If the fluid medium comprises water, the heat sink may be also referred to as a cold plate. The heat sink may be integrally formed with the receiving housing. Cooling channels and/or cooling ribs may be provided in the receiving housing. Alternatively, the heat sink may be a separate component. The heat sink may be a cold plate attached to further components of the receiving housing. Moreover, the first thermal contact surface and/or the second thermal contact surface may be adapted to have a reduced thermal contact resistance. The first thermal contact surface and/or the second thermal contact surface may be polished to reduce the surface roughness.

It is to be noted that the feature, wherein the ECU can be inserted and slide into the receiving housing does not necessarily require the receiving housing to have a closed shape, as will be particularly understood when considering the figures.

The electric coupling system has several advantages, wherein three of them are set out in the following. Thereby it is understood that these advantages may also apply for the following.

First, by the guide element and the guide track being configured such that the ECU can be rotated relative to the receiving unit while coupling the ECU with the receiving unit, it can be avoided to slide the thermal contact surfaces over each other in parallel. Hence, damage to these surfaces so as resulting poorer heat dissipation from the ECU can be avoided.

Second, by the guide element and the guide track being configured to be brought into sliding engagement with each other and such that the ECU can be rotated relative to the receiving unit while coupling the ECU with the receiving unit, it is possible to press the thermal contact surfaces against each other after they were arranged in the respective position to each other by sliding. Accordingly, an improved heat transfer from the ECU to the receiving unit can be achieved.

Third, by the guide element and the guide track being configured to allow sliding and rotating it is possible to provide an improved electrical connection and/or mechanical connection. Particularly, as the risk of detaching the ECU from the receiving unit is reduced. There are several reasons for this. For example, as already indicated in the previous paragraph, particularly reliable frictional connections can be achieved by sliding and subsequent rotation. In addition, sliding and rotating can be used to achieve improved positive-locking connections compared with sliding alone.

The guide element may comprise a substantially cylindrical protrusion and the guide track may comprise a guide slot, wherein an outer diameter of the cylindrical protrusion is adapted to the guide slot. In particular, the diameter of the cylindrical protrusion may substantially correspond to the slot size of the guide slot. With this configuration it can be ensured that the cylindrical protrusion is precisely guided and at the same time can be rotated. Nevertheless, it is understood that in an alternative embodiment the at least one guide track comprises a guide rail.

Optionally, the guide element protrudes from the ECU housing in a direction being substantially perpendicular to an insertion direction along which the ECU is to be inserted into the receiving housing and the guide track extends substantially parallel to the insertion direction.

The guide element and the guide track may be further configured such that a rotational axis around which the ECU can be rotated relative to the receiving unit while coupling the ECU with the receiving unit is substantially parallel to the first and the second thermal contact surface. Optionally the rotational axis is substantially perpendicular to the insertion direction along which the ECU is to be inserted into the receiving housing. Accordingly, a distance between the first thermal contact surface and the second thermal contact surface can be at least partially ensured while coupling the ECU with the receiving unit. Thereby it is possible to firstly avoid contact between the first and the second thermal contact surface while sliding and secondly press the surfaces against each other by rotation. Hence, as described above in more detail, the thermal, mechanical, and/or electrical connection between the ECU and the receiving unit may be enhanced.

Optionally, completing coupling the receiving unit with the ECU requires the ECU to be rotated relative to the receiving unit after the guide element is inserted into the guide track, whereby the first thermal contact surface is pressed against the second thermal contact surface. The advantages as described above apply for this configuration. Particularly regarding the improved thermal conductivity between the first thermal contact surface and the second thermal contact surface.

The guide track may be inclined relative to the second thermal contact surface such that a first portion of the guide track where the guide element is initially inserted is spaced further perpendicular to the second thermal contact surface than a second portion of the guide track where the guide element is located when the receiving unit is coupled with the ECU. Thereby it may be further avoided to slide the thermal contact surfaces over each other in parallel. Hence, damage to the thermal contact surfaces so as resulting poorer heat dissipation from the ECU can be avoided even more safely.

The guide track may be inclined relative to the second thermal contact surface by an angle which lies in a range from 0.1° to 10°, optionally from 0.3° to 5°, further optionally from 0.5° to 3°, and even further optionally from 0.7° to 2°. These angular ranges have proven to be advantageous in that, on the one hand, they reliably space the thermal contact surfaces from each other, and, on the other hand, they do not excessively increase the required installation space for the system.

Further, the electric connector and the electric counter connector may be arranged such that mating the electric connector with the electric counter connector is completed by completely inserting the guide element into the guide track. The electric connector and the electric counter connector may be arranged such that their mating direction substantially corresponds to the insertion direction along which the ECU is to be inserted into the receiving housing. Alternatively, the electric connector and the electric counter connector may be arranged such that mating the electric connector with the electric counter connector is completed by completely inserting the guide element into the guide track and subsequently rotating the ECU relative to the receiving unit. This could be the case when the electrical connector is arranged on the first thermal contact surface and the electrical counter connector is arranged on the second thermal contact surface. This alternative particularly contributes to a reliable mechanical and/or electrical connection due to a positive-locking connection. Nevertheless, it is understood that both above alternatives provide the advantage that they allow for a thermal, mechanical, and electrical connection by one coupling operation, i.e., coupling the ECU with the receiving unit.

Moreover, a layer of thermal interface material may be provided on the first thermal contact surface and/or on the second thermal contact surface. The thermal interface material, which may be also referred to as TIM, can be any material that may be inserted between two components to enhance the thermal coupling between them. The thermal interface material may comprise a thermal paste, a thermal adhesive, a thermal gap filler, a thermally conductive pad, a thermal tape, a phase-change material (PCM), and/or a metal thermal interface material. The layer of thermal interface material may enhance heat transfer from the ECU to the receiving unit. The use of the layer of thermal interface material is particularly enhanced by the configuration of the electric coupling system described above, which avoids or at least reduces damage to the thermal contact surfaces.

Optionally, the ECU housing comprises two guide elements that are each arranged on opposite faces of the ECU housing, and wherein the receiving housing comprises two guide tracks arranged on opposite faces of the ECU housing. Each of the two guide elements may comprise a substantially cylindrical protrusion and each of the two guide tracks may comprises a guide slot. Each guide element may be arranged for being guided by one guide track. The two guide elements and the two guide tracks may further enhance the stability of the electric coupling system.

The receiving housing may comprise a recess with a shape that partially corresponds to the shape of the ECU housing, wherein the guide tracks extend adjacent to the recess, and wherein the second thermal contact surface forms part of the recess and is located between the guide tracks. Hence, the ECU housing may slide into the recess. The recess might help to keep the ECU particularly stable in the receiving unit.

Further optionally, the ECU comprises a first fastening means and the receiving unit comprises a second fastening means, wherein the first and second fastening means are configured to retain the electric coupling system in the coupled state. The fastening means may comprise a latch, a screw connection, an adhesive connection, and/or a bolt connection. It is to be noted that one of the fastening means may be a surface with which the other fastening means engages. The fastening means may allow for an increased reliability of the system in terms of mechanical, electrical, and/or thermal connection.

Moreover optionally, engaging the first fastening means with the second fastening means rotates the ECU relative to the receiving unit, whereby the first thermal contact surface is pressed against the second thermal contact surface. Thereby transferring thermal energy between the ECU and the receiving unit may be further enhanced.

Furthermore, the electric coupling system may comprise a second ECU which is configured as the ECU described above, wherein in the coupled state the receiving unit is sandwiched between the two ECUs.

The ECUs may each comprise a fastening means, wherein the fastening means are configured to retain the electric coupling system in the coupled state. Optionally, engaging the fastening means rotates the ECUs relative to the receiving unit, whereby the ECUs are pressed against the receiving unit. The fastening means may be configured as described above. Hence, the advantages described above may also apply.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 6a shows the enlarged details of FIG. 5a.

In the drawings, reference numbers may be reused to identify similar and/or identical elements.

DETAILED DESCRIPTION

Figure 1:
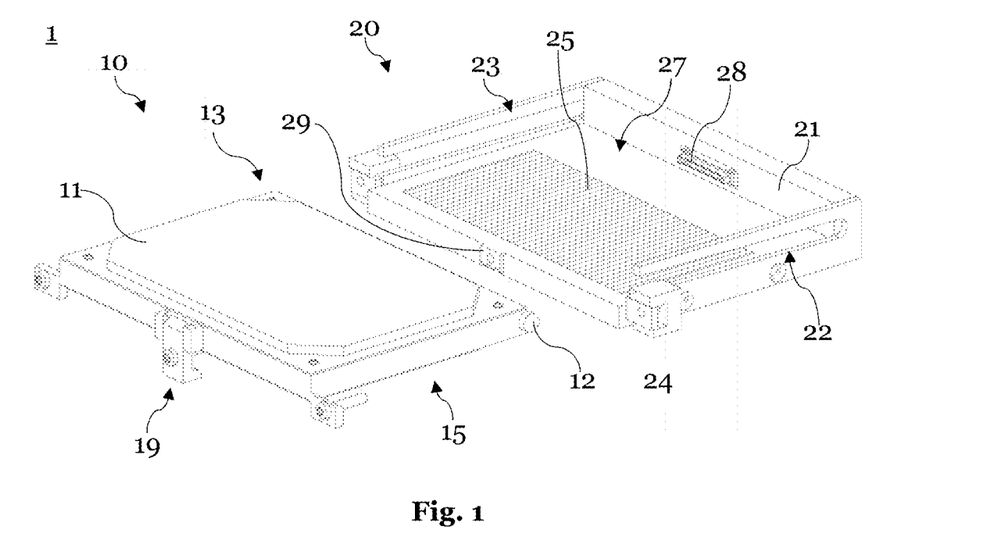
FIG. 1 shows an electric coupling system according to the present invention in perspective view.
Figure 2:
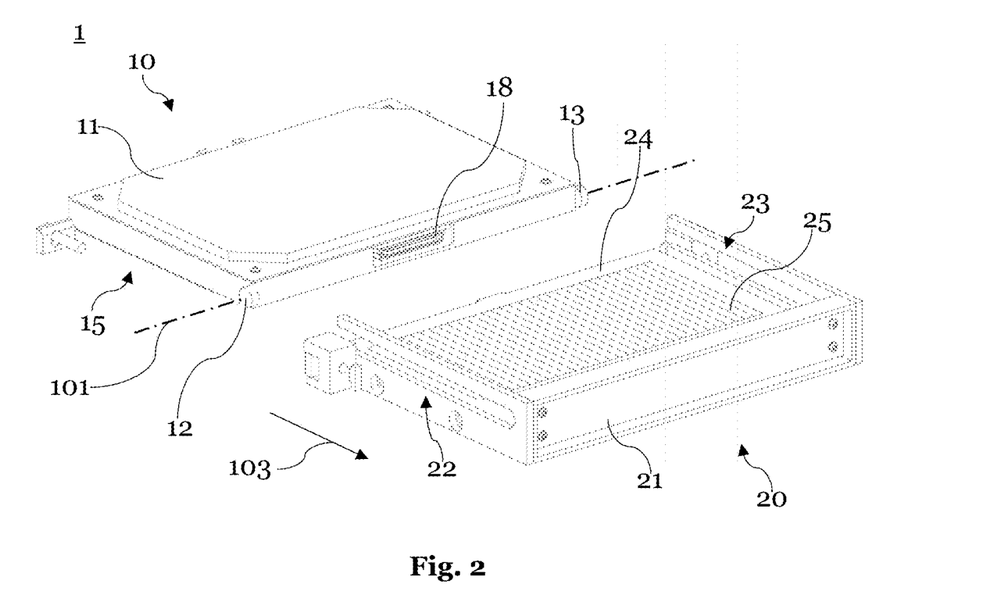
FIG. 2 shows the electric coupling system in a different perspective view.

FIGS. 1 and 2 show the electric coupling system 1 in perspective view before coupling. The electric coupling system 1 comprises an ECU 10 and a receiving unit 20 for coupling with the ECU 10. The ECU 10 comprises an ECU housing 11 having two guide elements 12, 13 and a first thermal contact surface 15. The ECU 10 further comprises an electric connector 18. The receiving unit 20 comprises a receiving housing 21 to accommodate the ECU 10 at least partially. The receiving housing 21 comprises two guide tracks 22, 23 and a heat sink 24 with a second thermal contact surface 25 for establishing planar contact with the first thermal contact surface 15. The guide elements 12, 13 each comprise a substantially cylindrical protrusion and the guide tracks 22, 23 each comprises a guide slot, wherein an outer diameter of the cylindrical protrusions is adapted to the guide slots respectively. Moreover, the receiving unit 20 comprises an electric counter connector 28 for mating with the electric connector 18.

As depicted in FIGS. 5a-c and FIGS. 6a-c, the guide elements 12, 13 and the guide tracks 22, 23 are configured to be brought into sliding engagement with each other such that the ECU 10 can be inserted and slide into the receiving housing 21. Further, the guide element 12, 13 and the guide track 22, 23 are configured such that the ECU 10 can be rotated relative to the receiving unit 20 while coupling the ECU 10 with the receiving unit 20.

Figure 3:
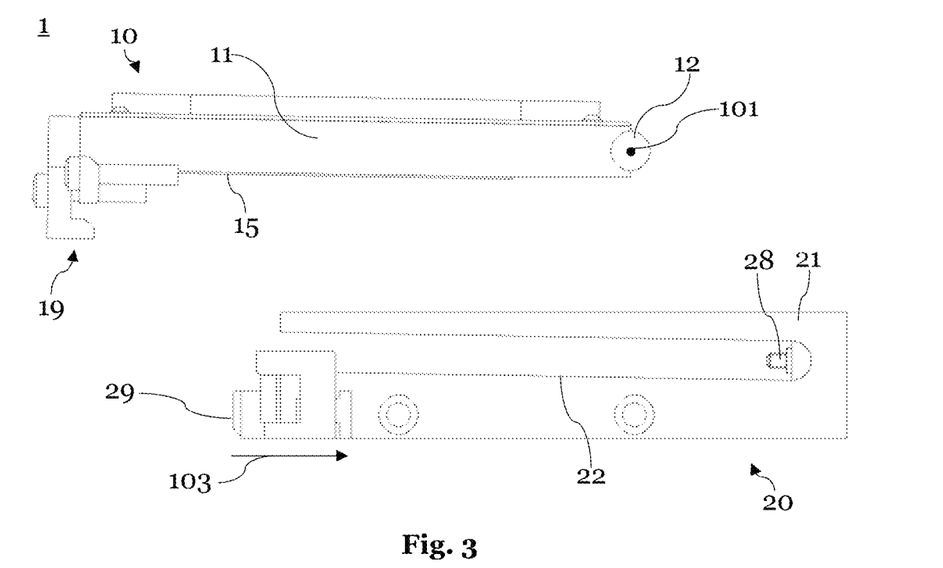
FIG. 3 shows the electric coupling system in a side view.

As the skilled person understands from FIGS. 2 and 3, the guide elements 12, 13 and the guide tracks 22, 23 are configured such that a rotational axis 101 around which the ECU 10 can be rotated relative to the receiving unit 20 while coupling the ECU 10 with the receiving unit 20 is substantially parallel to the first 15 and the second thermal contact surface 25. Thereby the rotational axis 101 is substantially perpendicular to an insertion direction 103 along which the ECU 10 is to be inserted into the receiving housing 21. Particularly, as shown in FIGS. 5a-c and FIGS. 6a-c, completing coupling the receiving unit 20 with the ECU 10 requires the ECU 10 to be rotated relative to the receiving unit 20 after the guide elements 12, 13 are inserted into the guide tracks 22, 23, whereby the first thermal contact surface 15 is pressed against the second thermal contact surface 25.

Figure 4:
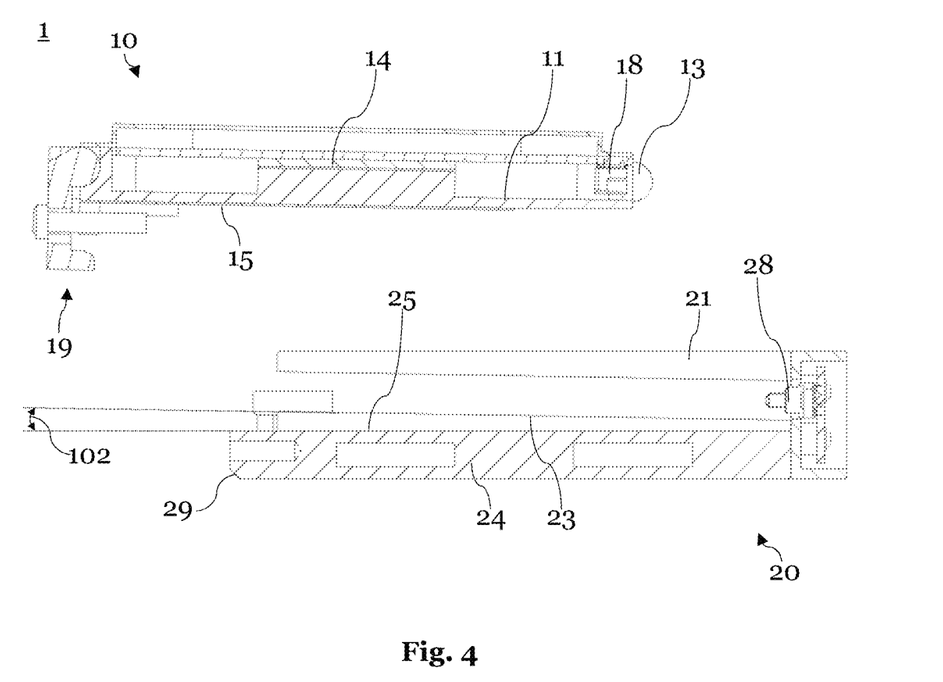
FIG. 4 shows the electric coupling system in a side cut side view.
Figure 5A:
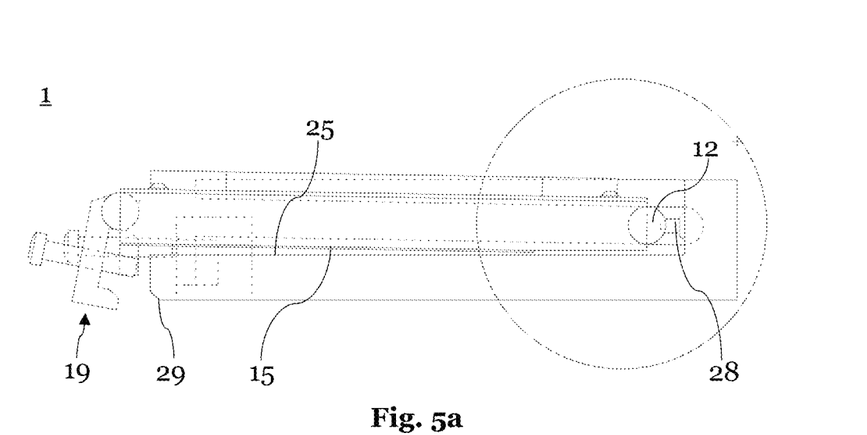
FIG. 5a shows the electric coupling system in a side cut side view.
Figure 5B:
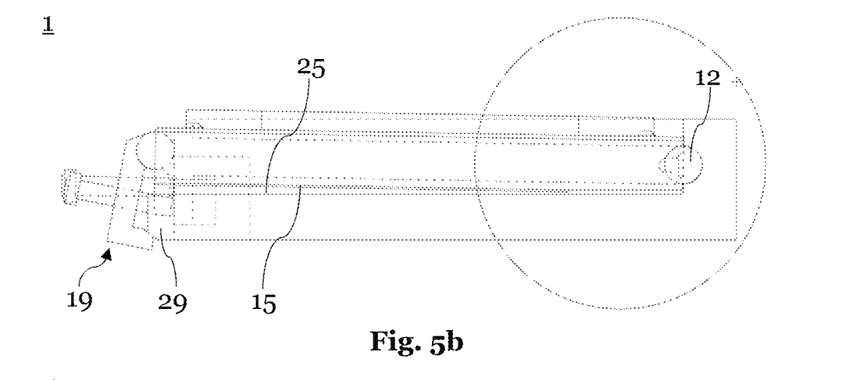
FIG. 5b shows the electric coupling system in a side cut side view.
Figure 5C:
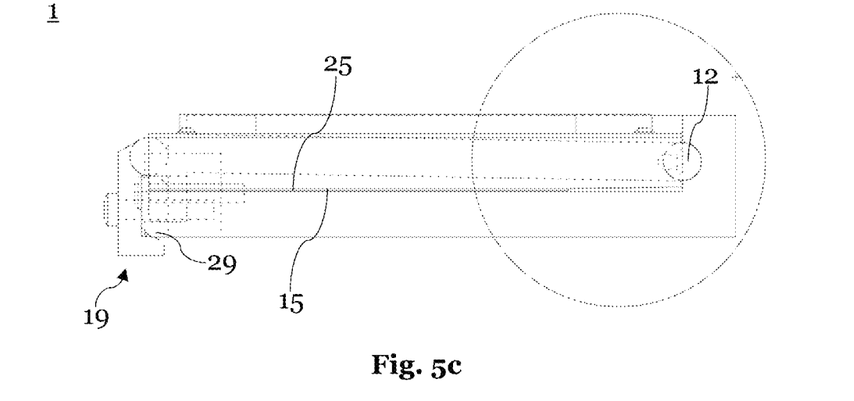
FIG. 5c shows the electric coupling system in a side cut side view.

Moreover, as in FIGS. 3 and 4, the guide tracks 22, 23 are inclined relative to the second thermal contact surface 25 such that a first portion of the guide tracks 22, 23 where the guide elements 12, 13 are initially inserted is spaced further perpendicular to the second thermal contact surface 25 than a second portion of the guide tracks 22, 23 where the guide elements 12, 13 are located when the receiving unit 20 is coupled with the ECU 10. In detail, the guide tracks 22, 23 are inclined relative to the second thermal contact surface 25 by an angle 102 which lies in a range 0.7° to 1.5°.

Figure 6A:
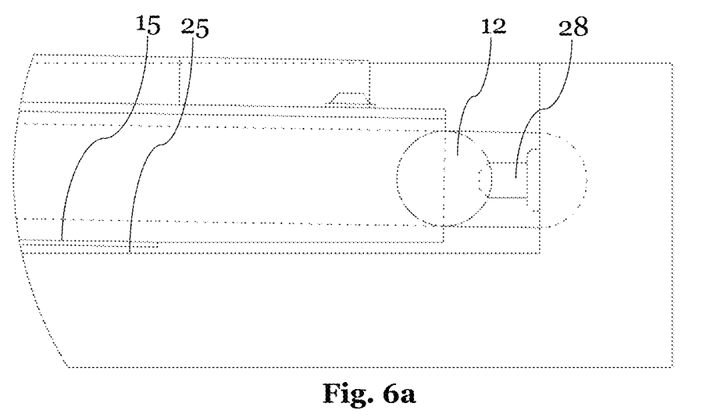
Figure 6B:
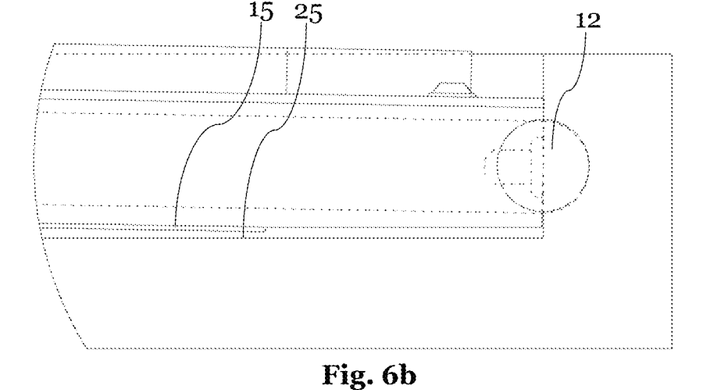
FIG. 6b shows the enlarged details of FIG. 5b.
Figure 6C:
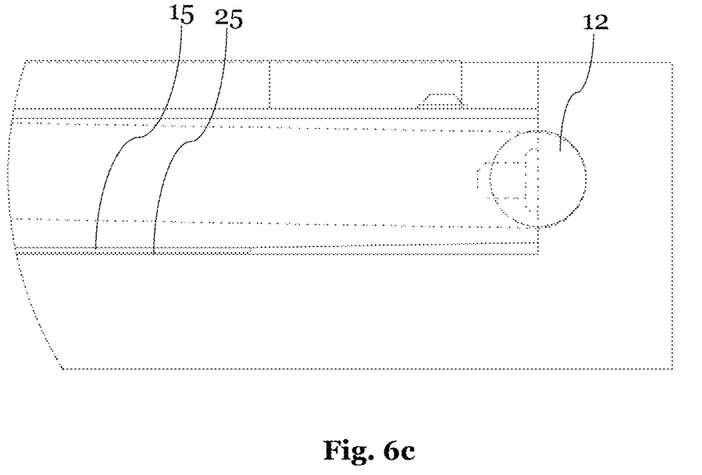
FIG. 6c shows the enlarged details of FIG. 5c.
Figure 7:
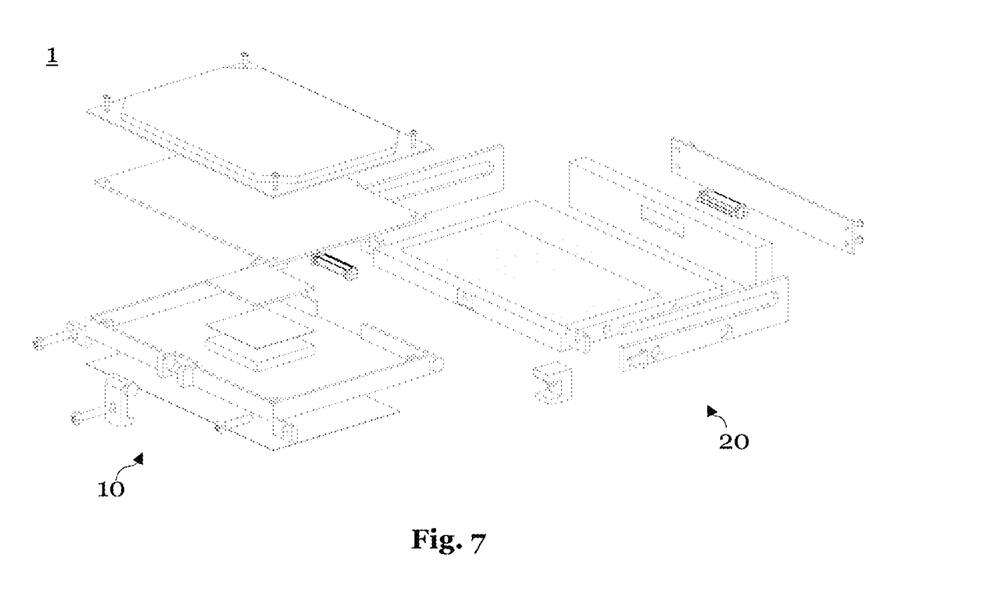
FIG. 7 shows the exploded view of FIG. 1.
Figure 8:
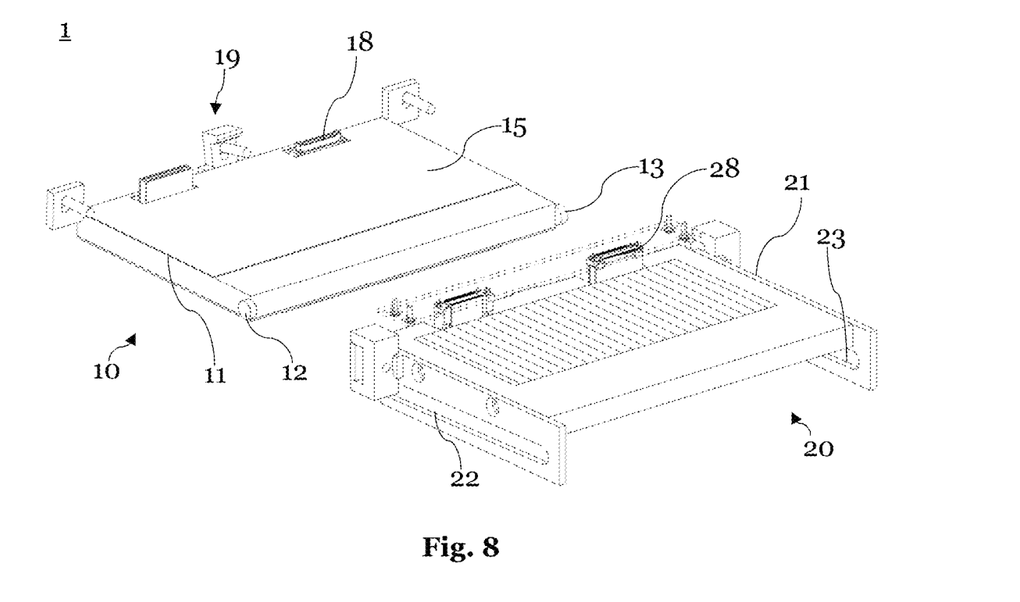
FIG. 8 shows the electric coupling system according to the present invention with an adapted connector configuration in perspective view.

The electric connector 18 and the electric counter connector 28 of FIGS. 1 to 7 are arranged such that mating the electric connector 18 with the electric counter connector 28 is completed by completely inserting the guide elements 12, 13 into the guide tracks 22, 23. The electric connector 18 and the electric counter connector 28 of FIG. 7 are arranged such that mating the electric connector 18 with the electric counter connector 28 is completed by completely inserting the guide elements 12, 13 into the guide tracks 22, 23 and subsequently rotating the ECU 10 relative to the receiving unit 20.

As shown in detail in FIGS. 6a-c, a layer of thermal interface material is provided on the first thermal contact surface 15. It is understood that on the second thermal contact surface 25 also thermal interface material may be provided.

Furthermore, according to FIGS. 1 and 2, the two guide elements 12, 13 are each arranged on opposite faces of the ECU housing 11, wherein the two guide tracks 22, 23 are arranged on opposite faces of the ECU housing 11. Moreover, the receiving housing 21 comprises a recess 27 with a shape that partially corresponds to the shape of the ECU housing 11. The guide tracks 22, 23 extend adjacent to the recess, wherein the second thermal contact surface 25 forms part of the recess 27 and is located between the guide tracks 22, 23.

Moreover, as shown in FIGS. 1 to 7, the ECU 10 comprises a first fastening means 19 and the receiving unit 20 comprises a second fastening means 29. According to FIG. 5c, the first 19 and second fastening means 29 are configured to retain the electric coupling system 1 in the coupled state. The skilled person understands from FIGS. 5a-c and FIGS. 6a-c, that engaging the first fastening means 19 with the second fastening means 29 rotates the ECU 10 relative to the receiving unit 20, whereby the first thermal contact surface 15 is pressed against the second thermal contact surface 25.

Figure 9A:
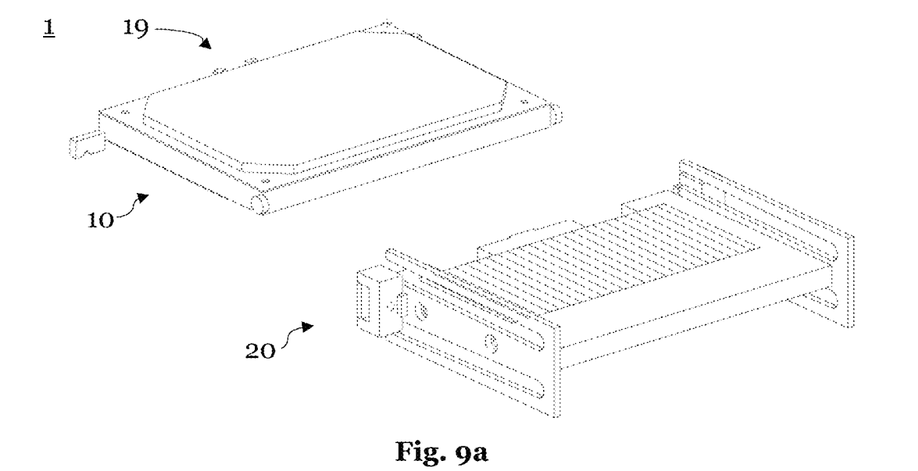
FIG. 9a shows in perspective view the electric coupling system according to the present invention with two ECUs during coupling.
Figure 9B:
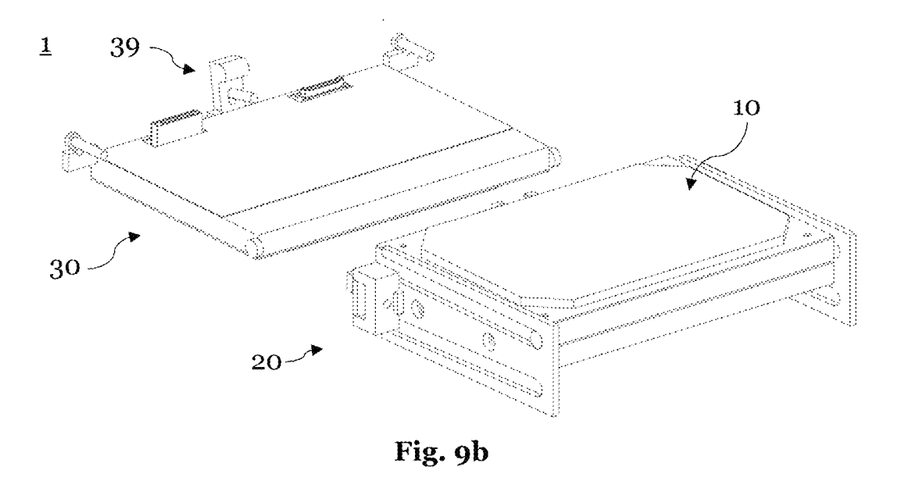
FIG. 9b shows in perspective view the electric coupling system according to the present invention with two ECUs during coupling.
Figure 9C:
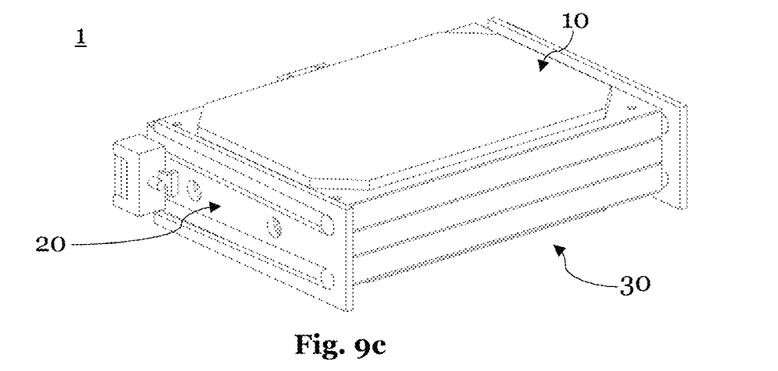
FIG. 9c shows in perspective view the electric coupling system according to the present invention with two ECUs during coupling.

Further, the coupling system 1 of FIGS. 9a-c comprises a second ECU 30 which is configured as the ECU 10 described above. In the coupled state, as shown in FIG. 9c, the receiving unit 20 is sandwiched between the two ECUs 10, 30. The ECUs 10, 30 each comprise a fastening means 19, 39, wherein the fastening means 19, 39 are configured to retain the electric coupling system 1 in the coupled state. Further, engaging the fastening means 19, 39 rotates the ECUs 10, 30 relative to the receiving unit 20, whereby the ECUs 10, 30 are pressed against the receiving unit 20.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

LIST OF REFERENCES 1 electric coupling system
10 ECU
11 ECU housing
12 first guide element
13 second guide element
14 integrated circuit
15 first thermal contact surface
18 electric connector
19 first fastening means
20 receiving unit
21 receiving housing
22 first guide track
23 second guide track
24 heat sink
25 second thermal contact surface
27 recess
28 electric counter connector
29 second fastening means
30 second ECU
39 fastening means of the second ECU
101 rotational axis
102 inclination angle
103 insertion direction

The invention claimed is:
1. An electric coupling system comprising:
an electronic control unit (ECU) including:
an ECU housing having at least one guide element and a first thermal contact surface, and
an electric connector; and
a receiving unit configured to couple with the ECU and including:

a receiving housing to accommodate the ECU at least partially, wherein the receiving housing includes at least one guide track and a heat sink with a second thermal contact surface for establishing planar contact with the first thermal contact surface, and an electric counter connector for mating with the electric connector, wherein the guide element and the guide track are configured to be brought into sliding engagement with each other such that the ECU can be inserted and slide into the receiving housing, and wherein the guide element and the guide track are further configured such that the ECU can be rotated relative to the receiving unit while coupling the ECU with the receiving unit.

2. The electric coupling system of claim 1 wherein:

the guide element includes a substantially cylindrical protrusion, the guide track includes a guide slot, and an outer diameter of the cylindrical protrusion is adapted to the guide slot.

3. The electric coupling system of claim 1 wherein:

the guide element and the guide track are further configured to create a rotational axis around which the ECU can be rotated relative to the receiving unit while coupling the ECU with the receiving unit; and the rotational axis is substantially parallel to the first thermal contact surface and the second thermal contact surface.

4. The electric coupling system of claim 3 wherein the rotational axis is substantially perpendicular to an insertion direction along which the ECU is to be inserted into the receiving housing.

5. The electric coupling system of claim 3 wherein completing coupling the receiving unit with the ECU requires the ECU to be rotated relative to the receiving unit after the guide element is inserted into the guide track, which presses the first thermal contact surface against the second thermal contact surface.

6. The electric coupling system of claim 1 wherein the guide track is inclined relative to the second thermal contact surface such that a first portion of the guide track where the guide element is initially inserted is spaced further perpendicular to the second thermal contact surface than a second portion of the guide track where the guide element is located when the receiving unit is coupled with the ECU.

7. The electric coupling system of claim 6 wherein the guide track is inclined relative to the second thermal contact surface by an angle in a range from 0.1° to 10°.

8. The electric coupling system of claim 6 wherein the guide track is inclined relative to the second thermal contact surface by an angle in a range from 0.7° to 2°.

9. The electric coupling system of claim 1 wherein the electric connector and the electric counter connector are arranged such that mating the electric connector with the electric counter connector is completed by at least one of:

completely inserting the guide element into the guide track, or completely inserting the guide element into the guide track and subsequently rotating the ECU relative to the receiving unit.

10. The electric coupling system of claim 1 wherein a layer of thermal interface material is provided on at least one of the first thermal contact surface or the second thermal contact surface.

11. The electric coupling system of claim 1 wherein:

the ECU housing includes two guide elements that are each arranged on opposite faces of the ECU housing, and the receiving housing includes two guide tracks arranged on opposite faces of the ECU housing.

12. The electric coupling system of claim 11 wherein:

the receiving housing includes a recess with a shape that partially corresponds to the shape of the ECU housing, the guide tracks extend adjacent to the recess, and the second thermal contact surface forms part of the recess and is located between the guide tracks.

13. The electric coupling system of claim 1 wherein:

the ECU includes a first fastener and the receiving unit includes a second fastener, and the first fastener and the second fastener are configured to retain the electric coupling system in a coupled state.

14. The electric coupling system of claim 13 wherein engaging the first fastener with the second fastener rotates the ECU relative to the receiving unit, whereby the first thermal contact surface is pressed against the second thermal contact surface.

15. The electric coupling system of claim 1 further comprising:

a second ECU that has a same configuration as the ECU, wherein, in a coupled state, the receiving unit is sandwiched between the ECU and the second ECU.

16. The electric coupling system of claim 15 wherein:

the ECU includes a first fastener;

the second ECU includes a second fastener; and the first fastener and the second fastener are configured to retain the electric coupling system in the coupled state.

17. The electric coupling system of claim 16 wherein engaging the first and second fasteners rotates the ECU and the second ECU relative to the receiving unit, which presses the first ECU and the second ECU against the receiving unit.

* * * * *